United States Patent
Sreenivasan et al.

(10) Patent No.: US 7,780,893 B2
(45) Date of Patent: Aug. 24, 2010

(54) METHOD OF CONCURRENTLY PATTERNING A SUBSTRATE HAVING A PLURALITY OF FIELDS AND A PLURALITY OF ALIGNMENT MARKS

(75) Inventors: Sidlgata V. Sreenivasan, Austin, TX (US); Ian M. McMackin, Austin, TX (US); Christopher Mark Melliar-Smith, Austin, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/695,850

(22) Filed: Apr. 3, 2007

(65) Prior Publication Data

US 2007/0228610 A1 Oct. 4, 2007

Related U.S. Application Data

(60) Provisional application No. 60/788,806, filed on Apr. 3, 2006.

(51) Int. Cl.
*B28B 11/08* (2006.01)
(52) U.S. Cl. .................... 264/293; 977/887; 356/399
(58) Field of Classification Search ................ 438/401; 356/399; 977/887; 264/293
See application file for complete search history.

(56) References Cited

U.S. PATENT DOCUMENTS

| 3,503,538 A | 3/1970 | Barnes |
| 3,783,520 A | 1/1974 | King |

(Continued)

FOREIGN PATENT DOCUMENTS

CN 1442757 A 9/2003

(Continued)

OTHER PUBLICATIONS

PCT/US07/08434 International Search Report, Jul. 15, 2008.

(Continued)

*Primary Examiner*—Christina Johnson
*Assistant Examiner*—Galen Hauth
(74) *Attorney, Agent, or Firm*—Laura C. Robinson

(57) ABSTRACT

A method of patterning a substrate comprising first and second fields with a template, the template having a mold and a plurality of alignment forming areas and a plurality of template alignment marks, the method comprising: positioning a material on the first field of the substrate and a plurality of regions of the substrate, the plurality of regions laying outside of the first and second fields; positioning the mold and the substrate such that a desired spatial relationship between the mold and the first field of the substrate is obtained to define a pattern in the material on the first field of the substrate while concurrently defining a plurality of substrate alignment marks with the material in the plurality of regions of the substrate in superimposition with the plurality of alignment forming areas of the template; positioning a material on the second field of the substrate; and positioning the mold and the substrate to obtain a desired spatial relationship between the plurality of template alignment marks and the plurality of substrate alignment marks such that a desired spatial relationship between the mold and the second field of the substrate is obtained to define a pattern in the material on the second field of the substrate.

18 Claims, 11 Drawing Sheets

U.S. PATENT DOCUMENTS

| | | | |
|---|---|---|---|
| 4,022,855 A | 5/1977 | Hamblen | |
| 4,070,116 A | 1/1978 | Frosch et al. | |
| 4,208,240 A | 6/1980 | Latos | |
| 4,326,805 A | 4/1982 | Feldman et al. | |
| 4,364,971 A | 12/1982 | Sack et al. | |
| 4,440,804 A | 4/1984 | Milgram | |
| 4,512,848 A | 4/1985 | Deckman et al. | |
| 4,521,445 A | 6/1985 | Nablo et al. | |
| 4,552,832 A | 11/1985 | Blume et al. | |
| 4,576,900 A | 3/1986 | Chiang | |
| 4,600,309 A | 7/1986 | Fay | |
| 4,637,904 A | 1/1987 | Rounds | |
| 4,676,868 A | 6/1987 | Riley et al. | |
| 4,707,218 A | 11/1987 | Giammarco et al. | |
| 4,731,155 A | 3/1988 | Napoli et al. | |
| 4,737,425 A | 4/1988 | Lin et al. | |
| 4,848,911 A | 7/1989 | Uchida et al. | |
| 4,857,477 A | 8/1989 | Kanamori | |
| 4,862,019 A | 8/1989 | Ashmore, Jr. | |
| 4,866,307 A | 9/1989 | Ashmore, Jr. | |
| 4,897,228 A | 1/1990 | Miwa et al. | |
| 4,908,298 A | 3/1990 | Hefferon et al. | |
| 4,909,151 A | 3/1990 | Fukui et al. | |
| 4,919,748 A | 4/1990 | Bredbenner et al. | |
| 4,921,778 A | 5/1990 | Thackeray et al. | |
| 4,929,083 A | 5/1990 | Brunner | |
| 4,932,358 A | 6/1990 | Studley et al. | |
| 4,936,465 A | 6/1990 | Zold | |
| 4,957,663 A | 9/1990 | Zwiers et al. | |
| 4,959,252 A | 9/1990 | Bonnebat et al. | |
| 4,964,945 A | 10/1990 | Calhoun | |
| 4,980,316 A | 12/1990 | Huebner | |
| 5,003,062 A | 3/1991 | Yen | |
| 5,028,361 A | 7/1991 | Fujimoto | |
| 5,028,366 A | 7/1991 | Harakal et al. | |
| 5,053,318 A | 10/1991 | Gulla et al. | |
| 5,072,126 A | 12/1991 | Progler | |
| 5,073,230 A | 12/1991 | Maracas et al. | |
| 5,074,667 A | 12/1991 | Miyatake | |
| 5,110,514 A | 5/1992 | Soane | |
| 5,124,089 A | 6/1992 | Ohkoshi et al. | |
| 5,126,006 A | 6/1992 | Cronin et al. | |
| 5,148,036 A | 9/1992 | Matsugu et al. | |
| 5,148,037 A | 9/1992 | Suda et al. | |
| 5,151,754 A | 9/1992 | Ishibashi et al. | |
| 5,204,739 A | 4/1993 | Domenicali | |
| 5,212,147 A | 5/1993 | Sheats | |
| 5,218,193 A | 6/1993 | Miyatake | |
| 5,232,874 A | 8/1993 | Rhodes et al. | |
| 5,240,550 A | 8/1993 | Boehnke et al. | |
| 5,240,878 A | 8/1993 | Fitzsimmons et al. | |
| 5,244,818 A | 9/1993 | Jokerst et al. | |
| 5,246,880 A | 9/1993 | Reele et al. | |
| 5,250,472 A | 10/1993 | Chen et al. | |
| 5,259,926 A | 11/1993 | Kuwabara et al. | |
| 5,277,749 A | 1/1994 | Griffith et al. | |
| 5,288,436 A | 2/1994 | Liu et al. | |
| 5,324,683 A | 6/1994 | Fitch et al. | |
| 5,328,810 A | 7/1994 | Lowrey et al. | |
| 5,330,881 A | 7/1994 | Sidman et al. | |
| 5,331,371 A | 7/1994 | Mori et al. | |
| 5,355,219 A | 10/1994 | Araki et al. | |
| 5,357,122 A | 10/1994 | Okubora et al. | |
| 5,362,606 A | 11/1994 | Hartney et al. | |
| 5,362,940 A | 11/1994 | MacDonald et al. | |
| 5,364,222 A | 11/1994 | Akimoto et al. | |
| 5,366,851 A | 11/1994 | Novembre | |
| 5,371,822 A | 12/1994 | Horwitz et al. | |
| 5,374,327 A | 12/1994 | Imahashi et al. | |
| 5,376,810 A | 12/1994 | Hoenk et al. | |
| 5,407,763 A * | 4/1995 | Pai | 430/5 |
| 5,414,514 A | 5/1995 | Smith et al. | |
| 5,422,295 A | 6/1995 | Choi et al. | |
| 5,424,549 A | 6/1995 | Feldman | |
| 5,425,848 A | 6/1995 | Haisma et al. | |
| 5,431,777 A | 7/1995 | Austin et al. | |
| 5,434,107 A | 7/1995 | Paranjpe | |
| 5,445,195 A | 8/1995 | Kim | |
| 5,449,117 A | 9/1995 | Muderlak et al. | |
| 5,451,435 A | 9/1995 | Yu | |
| 5,452,090 A | 9/1995 | Progler et al. | |
| 5,453,157 A | 9/1995 | Jeng | |
| 5,458,520 A | 10/1995 | DeMercurio et al. | |
| 5,468,542 A | 11/1995 | Crouch | |
| 5,477,058 A | 12/1995 | Sato | |
| 5,480,047 A | 1/1996 | Tanigawa et al. | |
| 5,504,793 A | 4/1996 | Chen | |
| 5,508,527 A | 4/1996 | Kuroda et al. | |
| 5,512,131 A | 4/1996 | Kumar et al. | |
| 5,542,605 A | 8/1996 | Campau | |
| 5,545,367 A | 8/1996 | Bae et al. | |
| 5,601,641 A | 2/1997 | Stephens | |
| 5,612,068 A | 3/1997 | Kempf et al. | |
| 5,628,917 A | 5/1997 | MacDonald et al. | |
| 5,633,505 A | 5/1997 | Chung et al. | |
| 5,643,364 A | 7/1997 | Zhao et al. | |
| 5,654,238 A | 8/1997 | Cronin et al. | |
| 5,669,303 A | 9/1997 | Maracas et al. | |
| 5,736,424 A | 4/1998 | Prybyla et al. | |
| 5,737,064 A | 4/1998 | Inoue et al. | |
| 5,753,014 A | 5/1998 | Van Rijn | |
| 5,772,905 A | 6/1998 | Chou | |
| 5,776,748 A | 7/1998 | Singhvi et al. | |
| 5,804,474 A | 9/1998 | Sakaki et al. | |
| 5,808,742 A * | 9/1998 | Everett et al. | 356/509 |
| 5,812,629 A | 9/1998 | Clauser | |
| 5,817,579 A | 10/1998 | Ko et al. | |
| 5,820,769 A | 10/1998 | Chou | |
| 5,843,363 A | 12/1998 | Mitwalsky et al. | |
| 5,849,209 A | 12/1998 | Kindt-Larsen et al. | |
| 5,849,222 A | 12/1998 | Jen et al. | |
| 5,858,580 A | 1/1999 | Wang et al. | |
| 5,877,036 A | 3/1999 | Kawai | |
| 5,877,861 A | 3/1999 | Ausschnitt et al. | |
| 5,888,650 A | 3/1999 | Calhoun et al. | |
| 5,895,263 A | 4/1999 | Carter et al. | |
| 5,900,160 A | 5/1999 | Whitesides et al. | |
| 5,907,782 A | 5/1999 | Wu | |
| 5,926,690 A | 7/1999 | Toprac et al. | |
| 5,948,470 A | 9/1999 | Harrison et al. | |
| 5,948,570 A | 9/1999 | Kornblit et al. | |
| 5,956,216 A | 9/1999 | Chou | |
| 5,974,150 A | 10/1999 | Kaish et al. | |
| 5,983,906 A | 11/1999 | Zhao et al. | |
| 5,999,245 A | 12/1999 | Suzuki | |
| 6,046,056 A | 4/2000 | Parce et al. | |
| 6,048,799 A | 4/2000 | Prybyla | |
| 6,049,373 A | 4/2000 | Miyatake | |
| 6,051,179 A | 4/2000 | Hagenau | |
| 6,067,144 A | 5/2000 | Murouchi | |
| 6,074,827 A | 6/2000 | Nelson et al. | |
| 6,088,103 A | 7/2000 | Everett et al. | |
| 6,128,070 A * | 10/2000 | Peng | 355/53 |
| 6,150,231 A | 11/2000 | Muller et al. | |
| 6,150,680 A | 11/2000 | Eastman et al. | |
| 6,153,886 A | 11/2000 | Hagiwara et al. | |
| 6,165,911 A | 12/2000 | Calveley | |
| 6,180,239 B1 | 1/2001 | Whitesides et al. | |
| 6,218,316 B1 | 4/2001 | Marsh | |
| 6,242,363 B1 | 6/2001 | Zhang | |
| 6,245,213 B1 | 6/2001 | Olsson et al. | |
| 6,274,294 B1 | 8/2001 | Hines | |
| 6,285,439 B1 | 9/2001 | Miyatake | |
| 6,295,120 B1 | 9/2001 | Miyatake | |

| Patent Number | Date | Inventor |
|---|---|---|
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,348,999 B1 | 2/2002 | Summersgill et al. |
| 6,355,198 B1 | 3/2002 | Kim et al. |
| 6,376,379 B1 | 4/2002 | Quek et al. |
| 6,383,888 B1 | 5/2002 | Stirton |
| 6,383,928 B1 | 5/2002 | Eissa |
| 6,387,330 B1 | 5/2002 | Bova et al. |
| 6,387,783 B1 | 5/2002 | Furukawa et al. |
| 6,387,787 B1 | 5/2002 | Mancini et al. |
| 6,388,253 B1 | 5/2002 | Su |
| 6,388,755 B1 | 5/2002 | Zhao |
| 6,391,217 B2 | 5/2002 | Schaffer et al. |
| 6,391,798 B1 | 5/2002 | DeFelice et al. |
| 6,420,892 B1 | 7/2002 | Krivy et al. |
| 6,423,207 B1 | 7/2002 | Heidari et al. |
| 6,482,742 B1 | 11/2002 | Chou |
| 6,489,068 B1 | 12/2002 | Kye |
| 6,495,907 B1 | 12/2002 | Jain et al. |
| 6,498,640 B1 | 12/2002 | Ziger |
| 6,503,829 B2 | 1/2003 | Kim et al. |
| 6,514,672 B2 | 2/2003 | Tsai et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,521,536 B1 | 2/2003 | Robinson |
| 6,522,411 B1 | 2/2003 | Moon et al. |
| 6,534,418 B1 | 3/2003 | Plat et al. |
| 6,541,360 B1 | 4/2003 | Lyons et al. |
| 6,565,928 B2 | 5/2003 | Sakamoto et al. |
| 6,580,172 B2 | 6/2003 | Mancini et al. |
| 6,580,505 B1 | 6/2003 | Bareket |
| 6,586,268 B1 | 7/2003 | Kopola et al. |
| 6,593,240 B1 | 7/2003 | Page |
| 6,621,960 B2 | 9/2003 | Wang et al. |
| 6,623,579 B1 | 9/2003 | Smith et al. |
| 6,627,544 B2 | 9/2003 | Izumi et al. |
| 6,629,292 B1 | 9/2003 | Corson et al. |
| 6,630,410 B2 | 10/2003 | Trapp et al. |
| 6,632,742 B2 | 10/2003 | Yang et al. |
| 6,635,581 B1 | 10/2003 | Wong |
| 6,636,311 B1 | 10/2003 | Ina et al. |
| 6,646,662 B1 | 11/2003 | Nebashi et al. |
| 6,665,014 B1 | 12/2003 | Assadi et al. |
| 6,665,119 B1 | 12/2003 | Kurtz et al. |
| 6,677,252 B2 | 1/2004 | Marsh |
| 6,678,038 B2 | 1/2004 | Binnard |
| 6,696,220 B2 | 2/2004 | Bailey et al. |
| 6,713,238 B1 | 3/2004 | Chou et al. |
| 6,719,915 B2 | 4/2004 | Willson et al. |
| 6,776,094 B1 | 8/2004 | Whitesides et al. |
| 6,791,669 B2 | 9/2004 | Poon |
| 6,809,356 B2 | 10/2004 | Chou |
| 6,819,426 B2 | 11/2004 | Sezginer et al. |
| 6,828,244 B2 | 12/2004 | Chou |
| 6,833,325 B2 | 12/2004 | Huang et al. |
| 6,849,558 B2 | 2/2005 | Schaper |
| 6,870,301 B2 | 3/2005 | Choi et al. |
| 6,873,087 B1 | 3/2005 | Choi et al. |
| 6,879,162 B2 | 4/2005 | Aguero et al. |
| 6,900,881 B2 | 5/2005 | Sreenivasan et al. |
| 6,902,853 B2 | 6/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,921,615 B2 | 7/2005 | Sreenivasan et al. |
| 6,932,934 B2 | 8/2005 | Choi et al. |
| 6,946,360 B2 | 9/2005 | Chou |
| 6,955,767 B2 | 10/2005 | Chen |
| 6,964,793 B2 | 11/2005 | Willson et al. |
| 6,986,975 B2 | 1/2006 | Sreenivasan et al. |
| 7,027,156 B2 | 4/2006 | Watts et al. |
| 7,071,088 B2 | 7/2006 | Watts et al. |
| 7,077,992 B2 | 7/2006 | Sreenivasan et al. |
| 7,105,452 B2 | 9/2006 | Sreenivasan |
| 7,117,583 B2 | 10/2006 | Dinan et al. |
| 7,128,875 B2 | 10/2006 | Cubicciotti |
| 7,136,150 B2 | 11/2006 | Sreenivasan et al. |
| 7,179,396 B2 | 2/2007 | Sreenivasan |
| 7,186,483 B2 | 3/2007 | Sreenivasan et al. |
| 7,214,624 B2 | 5/2007 | Fujita et al. |
| 7,244,386 B2 | 7/2007 | Sreenivasan et al. |
| 7,292,326 B2 | 11/2007 | Nimmakayala et al. |
| 7,360,851 B1 | 4/2008 | Snyder |
| 6,980,282 B2 | 12/2008 | Choi et al. |
| 2001/0023829 A1 | 9/2001 | Olsson et al. |
| 2002/0038916 A1 | 4/2002 | Chiu et al. |
| 2002/0042027 A1 | 4/2002 | Chou et al. |
| 2002/0094496 A1 | 7/2002 | Choi et al. |
| 2002/0110992 A1 | 8/2002 | Ho |
| 2002/0111036 A1 | 8/2002 | Zhu et al. |
| 2002/0132482 A1 | 9/2002 | Chou |
| 2002/0167117 A1 | 11/2002 | Chou |
| 2002/0168578 A1 | 11/2002 | Wang et al. |
| 2002/0170880 A1 | 11/2002 | Chen |
| 2002/0191141 A1 | 12/2002 | Liao |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0112421 A1 | 6/2003 | Smith |
| 2003/0129542 A1 | 7/2003 | Shih et al. |
| 2003/0137494 A1 | 7/2003 | Tulbert |
| 2003/0151714 A1 | 8/2003 | Takahashi et al. |
| 2003/0174435 A1 | 9/2003 | Dinan et al. |
| 2003/0179354 A1 | 9/2003 | Araki et al. |
| 2003/0184917 A1 | 10/2003 | Chang et al. |
| 2003/0186140 A1 | 10/2003 | Fries |
| 2003/0197312 A1 | 10/2003 | Hougham et al. |
| 2003/0224116 A1 | 12/2003 | Chen et al. |
| 2003/0224262 A1 | 12/2003 | Lof et al. |
| 2004/0029041 A1 | 2/2004 | Shih et al. |
| 2004/0029396 A1 | 2/2004 | Zhang et al. |
| 2004/0033515 A1 | 2/2004 | Cao et al. |
| 2004/0036201 A1 | 2/2004 | Chou et al. |
| 2004/0046288 A1 | 3/2004 | Chou |
| 2004/0065252 A1 | 4/2004 | Sreenivasan et al. |
| 2004/0065976 A1 | 4/2004 | Sreenivasan et al. |
| 2004/0110856 A1 | 6/2004 | Young et al. |
| 2004/0112861 A1 | 6/2004 | Choi et al. |
| 2004/0118809 A1 | 6/2004 | Chou et al. |
| 2004/0124566 A1* | 7/2004 | Sreenivasan et al. ........ 264/494 |
| 2004/0131718 A1 | 7/2004 | Chou et al. |
| 2004/0137734 A1 | 7/2004 | Chou et al. |
| 2004/0146792 A1 | 7/2004 | Nimmakayala et al. |
| 2004/0156108 A1 | 8/2004 | Chou et al. |
| 2004/0192041 A1* | 9/2004 | Jeong et al. ................. 438/689 |
| 2004/0197843 A1 | 10/2004 | Chou et al. |
| 2004/0201890 A1 | 10/2004 | Crosby |
| 2004/0219246 A1 | 11/2004 | Jeans |
| 2004/0250945 A1 | 12/2004 | Zheng et al. |
| 2005/0037143 A1 | 2/2005 | Chou et al. |
| 2005/0051742 A1 | 3/2005 | Shiraishi |
| 2005/0056963 A1 | 3/2005 | McCutcheon |
| 2005/0064344 A1 | 3/2005 | Bailey et al. |
| 2005/0158637 A1 | 7/2005 | Kim et al. |
| 2005/0271955 A1 | 12/2005 | Cherala et al. |
| 2005/0284886 A1 | 12/2005 | Penciu |
| 2006/0017876 A1 | 1/2006 | Watts |
| 2006/0019183 A1 | 1/2006 | Voisin |

| | | | |
|---|---|---|---|
| 2006/0062867 | A1 | 3/2006 | Choi et al. |
| 2006/0076717 | A1 | 4/2006 | Sreenivasan et al. |
| 2006/0077374 | A1 | 4/2006 | Sreenivasan et al. |
| 2006/0113697 | A1 | 6/2006 | Sreenivasan |
| 2006/0114450 | A1 | 6/2006 | Nimmakayala et al. |
| 2006/0115999 | A1 | 6/2006 | Sreenivasan et al. |
| 2006/0158651 | A1 | 7/2006 | Watts et al. |
| 2007/0126150 | A1 | 6/2007 | GanapathiSubramanian et al. |
| 2007/0132152 | A1 | 6/2007 | Choi et al. |
| 2007/0170617 | A1 | 7/2007 | Choi et al. |
| 2007/0228609 | A1 | 10/2007 | Sreenivasan et al. |

FOREIGN PATENT DOCUMENTS

| | | |
|---|---|---|
| EP | 0398589 | 4/1998 |
| FR | 2677043 A1 | 12/1992 |
| JP | 55-88332 | 7/1980 |
| JP | 3-32888 | 2/1981 |
| JP | 58-129074 | 8/1983 |
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| TW | 419720 | 1/2001 |
| WO | WO 87/02935 | 5/1987 |
| WO | WO 98/10121 | 3/1998 |
| WO | WO 99/05724 | 2/1999 |
| WO | WO 99/45753 | 9/1999 |
| WO | WO 00/21689 | 4/2000 |
| WO | WO 01/47003 | 6/2001 |
| WO | WO 01/63361 | 8/2001 |
| WO | WO 01/69317 | 9/2001 |
| WO | WO 01/79589 | 10/2001 |
| WO | WO 01/79933 | 10/2001 |
| WO | WO 02/22916 | 3/2002 |
| WO | WO 02/24977 | 3/2002 |

OTHER PUBLICATIONS

Bailey, Imprint Template Advances and Surface Modification, and Defect Analysis for Step and Flash Imprint Lithography, Dissertation for the Degree of Doctor of Philosophy, The University of Texas at Austin, Aug. 2003.
Johnson et al., Advances in Step and Flash Imprint Lithography, SPIE Microlithography Conference Feb. 23, 2003.
Chou et al., Lithographically Induced Self-assembly of Periodic Polymer Micropillar Arrays, J. Vac. Sci. Technol. B 17 (6), pp. 3197-3202 Nov. 1, 1999.
Colburn et al., Step and Flash Imprint Lithography: A New Approach to High-Resolution Patterning, Proc. Of SPIE, vol. 3676 Mar. 1, 1999.
Chou, Nanoimprint Lithography and Lithographically Induced Self-Assembly, MRS Bulletin, pp. 512-517 Jul. 1, 2001.
Choi et al., Design of Orientation Stages for Step and Flash Imprint Lithography, Precision Engineering, pp. 192-199 Jan. 1, 2001.
Xia et al., Soft Lithography, Angew. Chem. Int. Ed., pp. 550-575 Jan. 1, 1998.
Mansky et al., Large-Area Domain Alignment in Block Copolymer Thin Films Using Electric Fields, Macromolecules. vol. 31. No. 13, pp. 4399-4401 Jun. 9, 1998.
Chou et al., Imprint Lithography with Sub-10 nm Feature Size and High Throughput, Microelectronic Engineering 35, pp. 237-240 Jan. 1, 1997.
Chou et al., Imprint of Sub-25 nm Vias and Trenches in Polymers, Appl. Phys. Lett. 67 (21) Nov. 20, 1995.
Nguyen, Asymmetric Fluid-Structure Dynamics in Nanoscale Imprint Lithography, The University of Texas at Austin, pp. 1-111 Aug. 1, 2001.
Uchida et al., A Mask-to-Wafer Alignment and Gap Setting Method for X-ray Lithography Using Gratings, J. Vac. Sci. Technol. B 9 (6), pp. 3202-3206 Nov. 1, 1991.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J. Vac. Sci. Technol. B 18(6), pp. 3557-3560 Nov. 1, 2000.
Abstract of Japanese Patent 55-88332, Apr. 14, 2004.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Chou et al., Ultrafast and Direct Imprint of Nanostructures in Silicon, Nature, Col. 417, (Jun. 2002), pp. 835-837 Jun. 1, 2002.
Armitage et al., Analysis of Overlay Distortion Patterns, SPIE vol. 921 Integrated Circuit Metrology, Inspection, and Process Control II (1988) Jan. 1, 1988.
Moon et al., Interferometric-Spatial-Phase Imaging for Six-Axis Mask Control, MIT NanoStructures Laboratory, Research Laboraty of Electronics Oct. 17, 2003.
Chen et al., Adaptive Alignment of Photomasks for Overlay Placement, Journal of Vacuum Science. B 20(6), pp. 3099-3105 Nov. 1, 2002.
U.S. Appl. No. 10/864,214, naming Inventors Sreenivasan et al., entitled An Imprint Lithography System to Produce a Light to Impinge upon and Polymerize a Liquid in Superimposition with Template Overlay Marks, filed Jun. 9, 2004.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
Wronosky et al., Wafer and Reticle Positioning System for the Extreme Ultraviolet Lithography Engineering Test Stand, Emerging Lithography Technologies, Proceedings of SPIE vol. 3997, pp. 829-839 Jul. 1, 2000.
Schneider et al., Stripes of Partially Fluorinated Alkyl Chains: Dipolar Langmuir Monolayers, J. Chem. Phys. vol. 122, Issue 9 Mar. 1, 2005.
Deng et al., Simulation of Exposure and Alignment for Nano-imprint Lithography, Proc. SPIE, vol. 4688-93, p. 842-849 Jan. 1, 2002.
Deng et al., Rigorous Electromagnetic Simulation Applied to Alignment Systems, Proc. SPIE, vol. 4346-164, p. 1533-1540 Jan. 1, 2001.
Choi et al., Distortion and Overlay Performance of UV Step and Repeat Imprint Lithography, MNE Micro- and Nano-Engineering Conference Sep. 1, 2004.
Nordquist et al., Image Placement Issues for ITO-based Step and Flash Imprint Lithography Templates, J. Vac. Sci. Technol. B, pp. 695-701 Mar. 1, 2004.
Gehoski et al., Evaluation of the Imprio 100 Step and Flash Imprint Lithography Tool, Proceedings of SPIE, vol. 5374, pp. 1006-1016 May 1, 2004.
Choi et al., Layer-to-Layer Alignment for Step and Flash Imprint Lithography, SPIE's 26th Intl. Symp. Microlithography: Emerging Lithographic Technologies, Santa Clara, CA Mar. 1, 2001.
Colburn et al., Dissertation for the Degree of Doctor of Philosophy, Step and Flash Imprint Lithography: A Low-Pressure, Room-Temperature Nanoimprint Lithography Aug. 1, 2001.
U.S. Appl. No. 11/695,469, naming Inventors Cherala et al., entitled Deformation Using Nullspace and Methods Optimization Techniques, filed Apr. 2, 2007.
U.S. Appl. No. 11/694,644, naming Inventors Nimmakayala et al., entitled Enhanced Multi Channel Alignment, filed Mar. 30, 2007.
U.S. Appl. No. 11/694,193, naming Inventors Shackleton et al., entitled Preserving Filled Features when Vacuum Wiping, filed Mar. 30, 2007.
Hara K et al., An Alignment Technique using Diffracted Moire Signals, Journal of Facuum Science and Technology: Part B, AVS /AIP, Melville, New York, NY, US, vol. 7, No. 6; pp. 1977-1979 Nov. 1, 1989.
Abstract of Japanese patent 02-192045, Jul. 27, 1990.

Wu, Large Area High Density Quantized Magnetic Disks Fabricated Using Nanoimprint Lithography, J. Vac. Sci. Technol. B 16(6), pp. 3825-3829 Nov. 1, 1998.

Gokan et al., Dry Etch Resistance of Organic Materials, J. Electrochem. Soc.: Solid-State Science and Technology, pp. 143-146 Jan. 1, 1983.

Braeuer et al., Precise Polymer Micro-Optical Systems, MRS Bulletin, pp. 519 - 522 Jul. 1, 2001.

Ruchhoeft et al., Patterning Curved Surfaces: Template Generation by Ion Beam Proximity Lithography and Relief Transfer by Step and Flash Imprint Lithography, Journal of Vacuum Science and Technology, pp. 1-17 Jan. 1, 2000.

Haisma et al., Mold-assisted Nanolithography: A Process for Reliable Pattern Replication, J. Vac. Sci. Technol. B, pp. 4124-4128 Nov. 1, 1996.

Xia et al., Soft Lithography, Annu Rev. Mater Sci. 1998 28: 153-184 Jan. 1, 1998.

Otto et al., Characterization and Application of a UV-based Imprint Technique, Microelectronic Engineering 57-58, pp. 361-366 Jan. 1, 2001.

Otto et al., Reproducibility and Homogeneity in Step and Repeat UV-Nanoimprint Lithography, Microelectronic Engineering 73-74, pp. 152-156 Jan. 1, 2004.

Kawata et al., Imprint/Photo Hybrid Litography Using Conventional Contact Aligner, Japanese Journal of Applied Physics, vol. 43, No. 6B, pp. 4027-4030 Jun. 29, 2004.

Kim et al., Reducing Photocurable Polymer Pattern Shrinkage and Roughness during Dry Etching in Photo-Nanoimprint Litography, Japanese Journal of Applied Physics, vol. 43, No. 6B, pp. 4022-4026 Jun. 29, 2004.

Abstract of Japanese Patent 58-129074, Aug. 1, 1983.

Colburn et al., Characterization and Modeling of Volumetric and Mechanical Properties for Step and Flash Imprint Lithography Photopolymers, Journal of Vacuum Science Technology. vol b. 19(6) Nov. 1, 2001.

Wilson et al., Lithography and Etch Issues, Handbook of Multilevel Metallization for Integrated Circuits, pp. 566-567 Jan. 1, 1993.

Park et al., Aligning Liquid Crystals Using Replicated Nanopatterns, PSI Scientific Report 2002, vol. VII, p. 85 Mar. 1, 2003.

McMackin et al., Design and Performance of a Step and Repeat Imprinting Machine, SPIE Microltihgraphy Conference Feb. 1, 2003.

Le et al., Development of an Etch-Definable Lift-Off Process for Use with Step and Flash Imprint Lithography, SPIE Microlithography Conference Feb. 1, 2005.

Cardinale et al., Fabrication of a Surface Acoustic Wave-Based Correlator Using Step-and Flash Imprint Lithography, J. Vac. Sci. Technol. B 22(6) Nov. 1, 2004.

Abstract of Japanese Patent 3-32888, Feb. 13, 1991.

Abstract of French Patent 2677043, Dec. 1, 1992.

U.S. Appl. No. 11/692,450, naming Inventors Sreenivasan et al., entitled Patterning a Plurality of Fields on a Substrate to Compensate for Differing Evaporation Times, filed Mar. 28, 2007.

U.S. Appl. No. 11/693,236, naming Inventors Schmid et al., entitled Self-Aligned Process for Fabricating Imprint Templates Containing Variously Etched Features, filed Mar. 29, 2007.

Thurn et al., Stress Hysteresis and Mechanical Properties of Plasma-Enhanced Chemical Vapor Deposited Dielectric Films, Journal of Applied Physics, vol. 95, No. 3, pp. 967-976 Feb. 1, 2004.

Modreanu et al., Optical Properties of LPCVD Silicon Oxynitride, Thin Solid Films 337, pp. 82-84, 1999.

Casey et al., Control of Metal Deposition in a Web Coater, Controlling in both Transverse and Machine Direction, Proceedings, Annual Technical Conference—Society of Vacuum Coaters May 4, 1990.

Lu et al., The Effect of Deposition Parameters on Performance of VME-FPC, Proceedings of the IEEE International Vacuum Microelectronics Conference, IVMC Aug. 16, 2001.

* cited by examiner

US 7,780,893 B2

METHOD OF CONCURRENTLY PATTERNING A SUBSTRATE HAVING A PLURALITY OF FIELDS AND A PLURALITY OF ALIGNMENT MARKS

CROSS-REFERENCE TO RELATED APPLICATION

The present application claims priority to U.S. Provisional Application No. 60/788,806, filed on Apr. 3, 2006, entitled "Shape of Level 0 and Level 1 Fields to Achieve In-Liquid Align," which is incorporated herein by reference.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a stage to obtain a desired position to facilitate patterning thereof. To that end, a mold is employed spaced-apart from the substrate with a formable liquid present between the mold and the substrate. The liquid is solidified to form a patterned layer that has a pattern recorded therein that is conforming to a shape of the surface of the mold in contact with the liquid. The mold is then separated from the patterned layer such that the mold and the substrate are spaced-apart. The substrate and the patterned layer are then subjected to processes to transfer, into the substrate, a relief image that corresponds to the pattern in the patterned layer.

DETAILED DESCRIPTION

Figure 1:
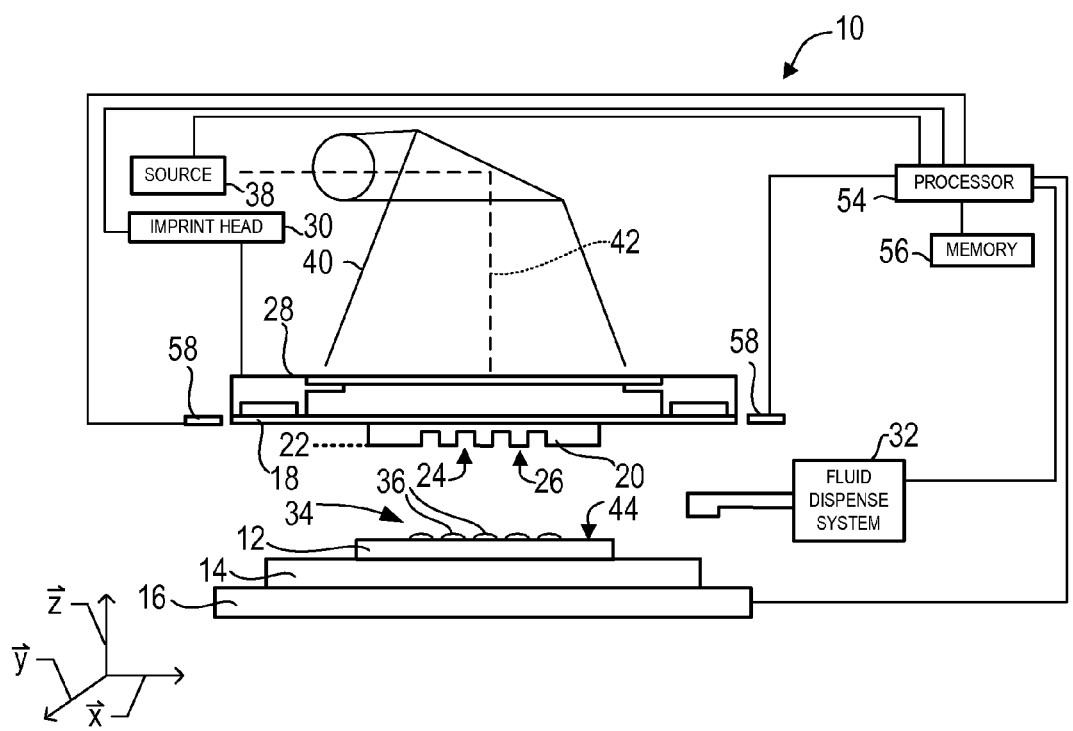
FIG. 1 is a simplified side view of a lithographic system having a template spaced-apart from a substrate.

Referring to FIG. 1, a system 10 to form a relief pattern on a substrate 12 is shown. Substrate 12 may be coupled to a substrate chuck 14. Substrate chuck 14 may be any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes," which is incorporated herein by reference. In a further embodiment, substrate chuck 14 may be a chuck as described in U.S. Pat. No. 6,982,783 entitled "Chucking System for Modulating Shapes of Substrates" and U.S. Pat. No. 6,980,282 entitled "Method for Modulating Shapes of Substrates", both of which are incorporated herein by reference. Substrate 12 and substrate chuck 14 may be supported upon a stage 16. Further, stage 16, substrate 12, and substrate chuck 14 may be positioned on a base (not shown). Stage 16 may provide motion about the x and y axes.

Spaced-apart from substrate 12 is a template 18 having a mold 20 extending therefrom towards substrate 20 with a patterning surface 22 thereon. Further, mesa 20 may be referred to as a mold 20. Mesa 20 may also be referred to as a nanoimprint mold 20. In a further embodiment, template 18 may be substantially absent of mold 20. Template 18 and/or mold 20 may be formed from such materials including but not limited to, fused-silica, quartz, silicon, organic polymers, siloxane polymers, borosilicate glass, fluorocarbon polymers, metal, and hardened sapphire. As shown, patterning surface 22 comprises features defined by a plurality of spaced-apart recesses 24 and protrusions 26. However, in a further embodiment, patterning surface 22 may be substantially smooth and/or planar. Patterning surface 20 may define an original pattern that forms the basis of a pattern to be formed on substrate 12.

Template 18 may be coupled to a template chuck 28, template chuck 28 being any chuck including, but not limited to, vacuum, pin-type, groove-type, or electromagnetic, as described in U.S. Pat. No. 6,873,087 entitled "High-Precision Orientation Alignment and Gap Control Stages for Imprint Lithography Processes". In a further embodiment, substrate chuck 14 may be a chuck as described in U.S. Pat. No. 6,982,783 entitled "Chucking System for Modulating Shapes of Substrates" and U.S. Pat. No. 6,980,282 entitled "Method for Modulating Shapes of Substrates". Template chuck 28 may be coupled to an imprint head 30 to facilitate movement of template 18 and mold 20.

System 10 further comprises a fluid dispense system 32. Fluid dispense system 32 may be in fluid communication with substrate 12 so as to deposit a polymeric material 34 thereon. System 10 may comprise any number of fluid dispensers and fluid dispense system 32 may comprise a plurality of dispensing units therein. Polymeric material 34 may be positioned upon substrate 12 using any known technique, e.g., drop dispense, spin-coating, dip coating, chemical vapor deposition (CVD), physical vapor deposition (PVD), thin film deposition, thick film deposition, and the like. As shown, polymeric material 34 may be deposited upon substrate 12 as a plurality of spaced-apart droplets 36. Typically, polymeric material 34 is disposed upon substrate 12 before the desired volume is defined between mold 20 and substrate 12. However, polymeric material 34 may fill the volume after the desired volume has been obtained.

Figure 2:
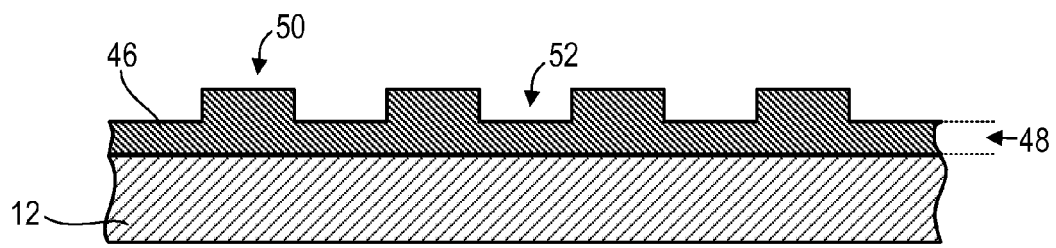
FIG. 2 is a simplified side view of the substrate shown in FIG. 1, having a patterned layer positioned thereon.

Referring to FIGS. 1 and 2, system 10 further comprises a source 38 of energy 40 coupled to direct energy 40 along a path 42. Imprint head 30 and stage 16 are configured to arrange mold 20 and substrate 12, respectively, to be in superimposition and disposed in path 42. Either imprint head 30, stage 16, or both vary a distance between mold 20 and substrate 12 to define a desired volume therebetween such that mold 20 contacts polymeric material 34 and the desired volume is filled by polymeric material 34. More specifically, polymeric material 34 of droplets 36 may ingress and fill recesses 24 of mold 20. After the desired volume is filled with polymeric material 34, source 38 produces energy 40, e.g., broadband ultraviolet radiation that causes polymeric material 34 to solidify and/or cross-link conforming to the shape of a surface 44 of substrate 12 and patterning surface 22, defining a patterned layer 46 on substrate 12. Patterned layer 46 may comprise a residual layer 48 and a plurality of features shown as protrusions 50 and recessions 52.

System 10 may further comprise an actuation system 58 surrounding template 18/mold 20 to facilitate alignment and overlay registration between mold 20 and substrate 12. Actuation system 58 facilitates alignment and overlay registration by selectively deforming template 18/mold 20. This facilitates correcting various parameters of the pattern shape, i.e., magnification characteristics, skew/orthogonality characteristics, and trapezoidal characteristics. An example of an actuation system 58 is described in U.S. Pat. No. 7,150,622 entitled "Systems for Magnification and Distortion Correction for Imprint Lithography Processes"; U.S. Pat. No. 7,170,589 entitled "Apparatus to Vary Dimensions of a Substrate During Nano-Scale Manufacturing"; and U.S. Pat. No. 6,916,585 entitled "Method of Varying Template Dimensions to Achieve Alignment During Imprint Lithography"; all of which are incorporated by reference herein.

System 10 may be regulated by a processor 54 that is in data communication with stage 16, imprint head 30, fluid dispense system 32, source 38, and actuation system 58 operating on a computer readable program stored in memory 56.

Figure 3:
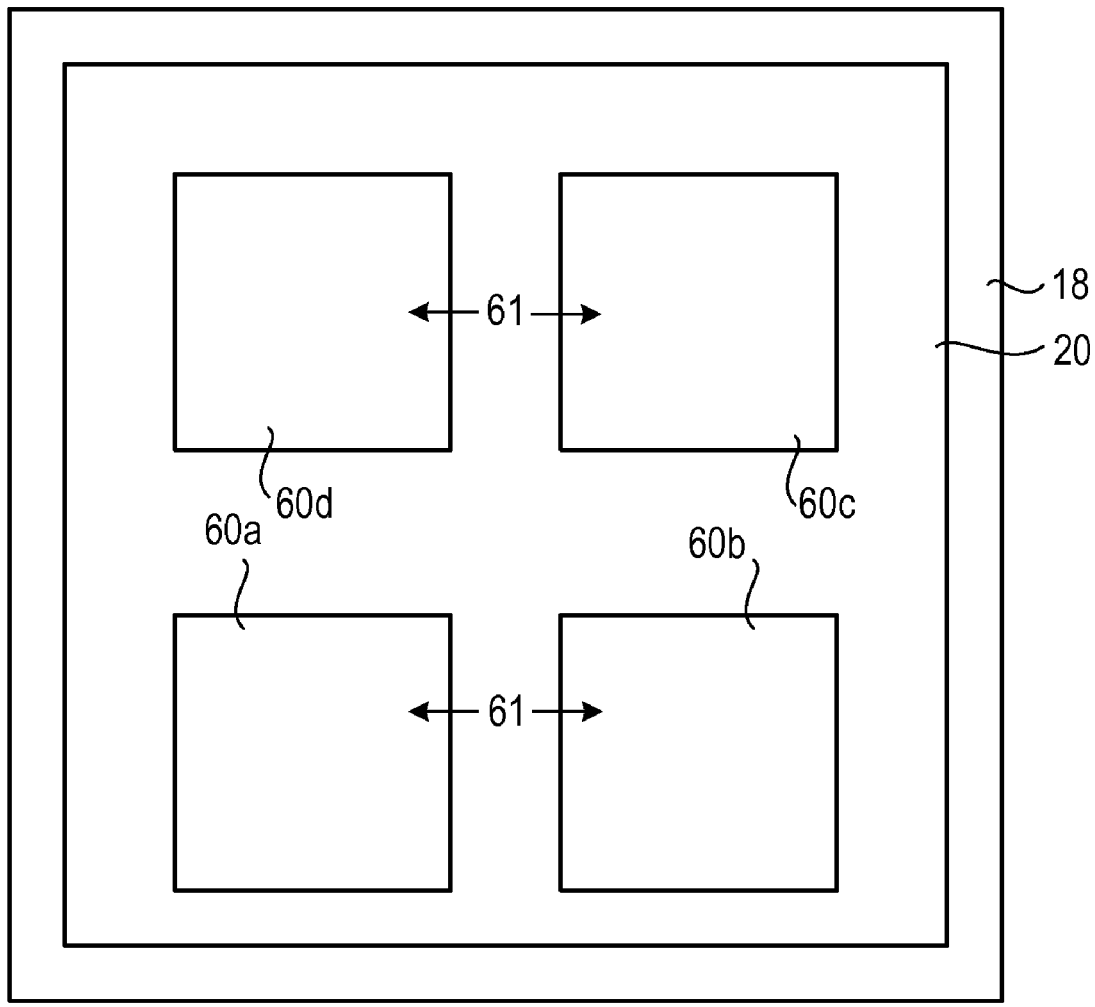
FIG. 3 is a top down view of the template shown in FIG. 1.

Referring to FIG. 3, a top down view of template 18 is shown. More specifically, mold 20 of template 18 is shown comprising a plurality of dies 60, shown as dies 60a-60d. However, in a further embodiment, mold 20 may comprise any number of dies, i.e., 2, 4, 6, 8, or 9 dies. Furthermore, each of dies 60a-60d may have substantially the same relief structure 61 formed therein. To that end, formation of dies 60 of mold 20 may be formed employing e-beam lithography. However, employing e-beam lithography may result in, inter alia, increased formation time of template 18, which may be undesirable. To that end, a method of minimizing formation time of dies 60 of mold 20 is described below.

Figure 4:
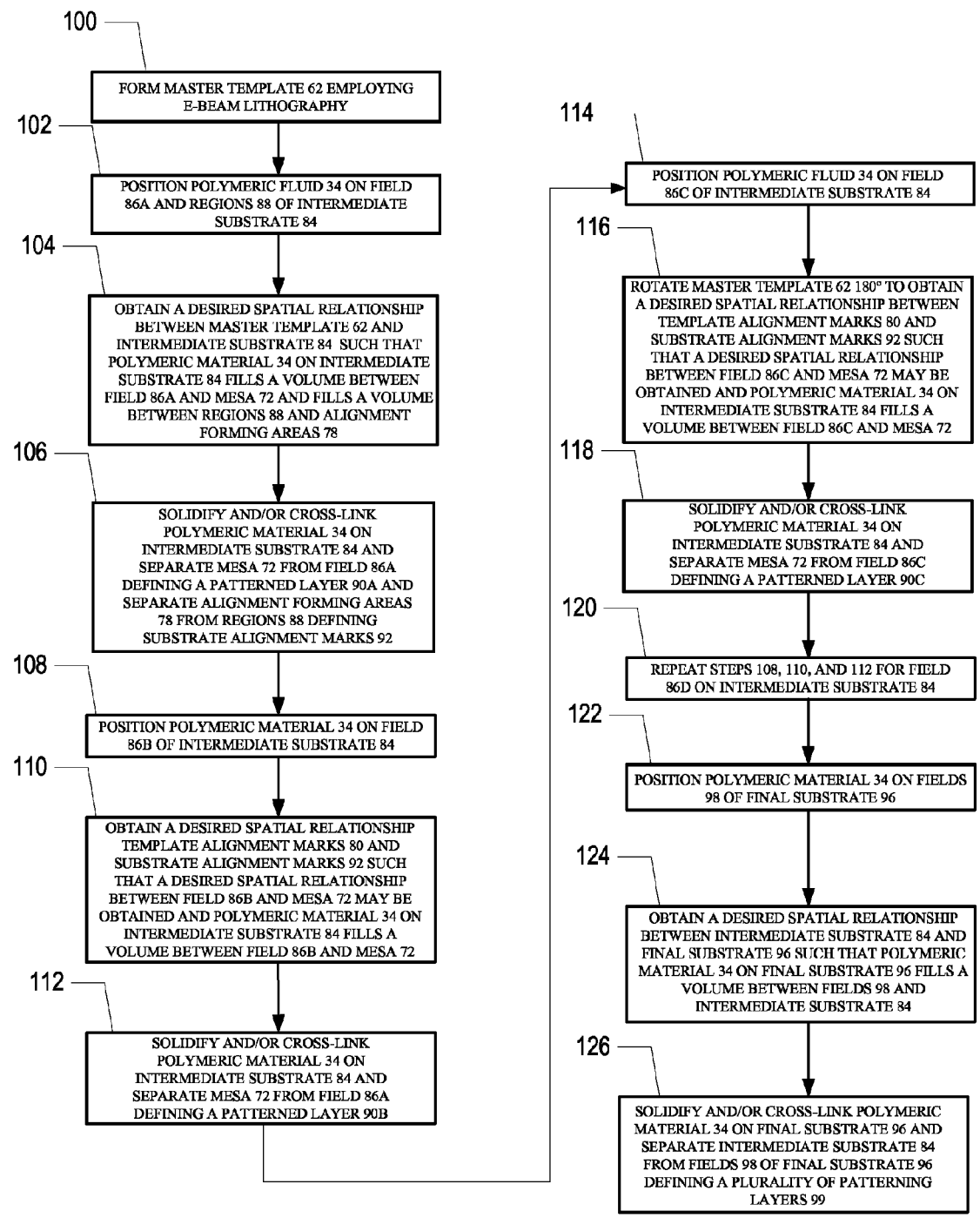
FIG. 4 is a flow chart of a method of forming the template shown in FIG. 1.
Figure 5:
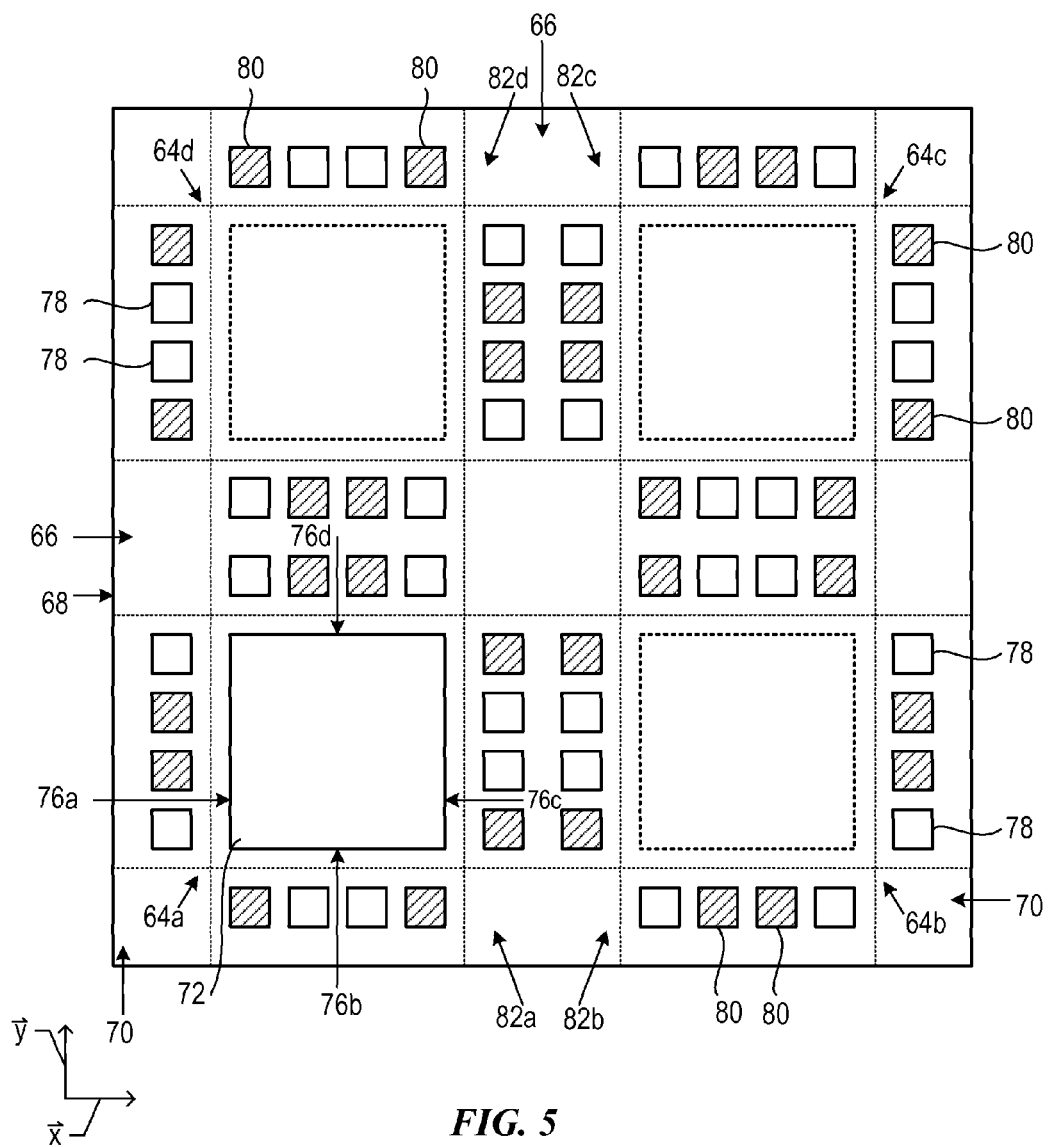
FIG. 5 is a top down view of a master template formed from e-beam lithography, the master template employed to form template shown in FIG. 1.

Referring to FIGS. 3-5, in a first embodiment, a method of forming dies 60 of mold 20 is shown. More specifically at step 100, a master template 62 may be formed employing e-beam lithography. Master template 62 comprises a plurality of sections 64, shown as sections 64a-64d. However, in a further embodiment, master template 62 may comprise any number of sections 64, i.e., 2, 4, 6, 8, or 9 sections. Each section of sections 64 may be separated from an adjacent section of sections 64 by a street 66. Further, each of sections 64 may be separated from a perimeter 68 of master template 62 by a street 70.

A section of sections 64 may comprises a mesa 72 having a relief pattern 74 defined therein. As shown, mesa 72 may be positioned in section 64a, however, in a further embodiment, mesa 72 may be positioned in any section of sections 64. Mesa 72 comprises sides 76a, 76b, 76c, and 76d, with side 76a being positioned opposite to side 76c and side 76b being positioned opposite to side 76d. In an example, master template 62 may have a thickness of equal to or greater than 4 mm.

Master template 62 may further comprise a plurality of alignment forming areas 78 and template alignment marks 80. Alignment forming areas 78 and template alignment marks 80 may be positioned within streets 66 and 70. In a further embodiment, alignment forming areas 78 and template alignment marks 80 may be positioned on a plurality of mesas. In still a further embodiment, alignment forming areas 78 may comprise checkerboard forming alignment marks and template alignment marks 80 may comprise grating alignment marks. In still a further embodiment, template alignment marks 80 may be substantially planar.

Positioned adjacent mesa 72 are a first subset of alignment forming areas 78 and template alignment marks 80 defining a first pattern 82a. As shown, positioned proximate each of sides 76a, 76b, 76c, and 76d are two alignment forming areas 78 and two template alignment marks 80. However, in a further embodiment, any number of alignment forming areas 78 and template alignment marks 80 may be positioned proximate sides 76a, 76b, 76c, and 76d.

Master template 62 may further comprise alignment forming areas 78 and template alignment marks 80 positioned in streets 66 and 70 proximate to the remaining sections 64 of master template 62. More specifically, a second, third, and fourth subsets of alignment forming areas 78 and template alignment marks 80 may be positioned in streets 66 and 70 proximate to sections 64b, 64c, and 64d, respectively, defining a second pattern 82b, a third pattern 82c, and a fourth pattern 82d, respectively. The first pattern 82a may be substantially the same as the third pattern 82c and the second pattern 82b may be substantially the same as the fourth pattern 82d. Further, the first and third patterns 82a and 82c may be differ from the second and fourth patterns 82b and 82d.

Figure 6:
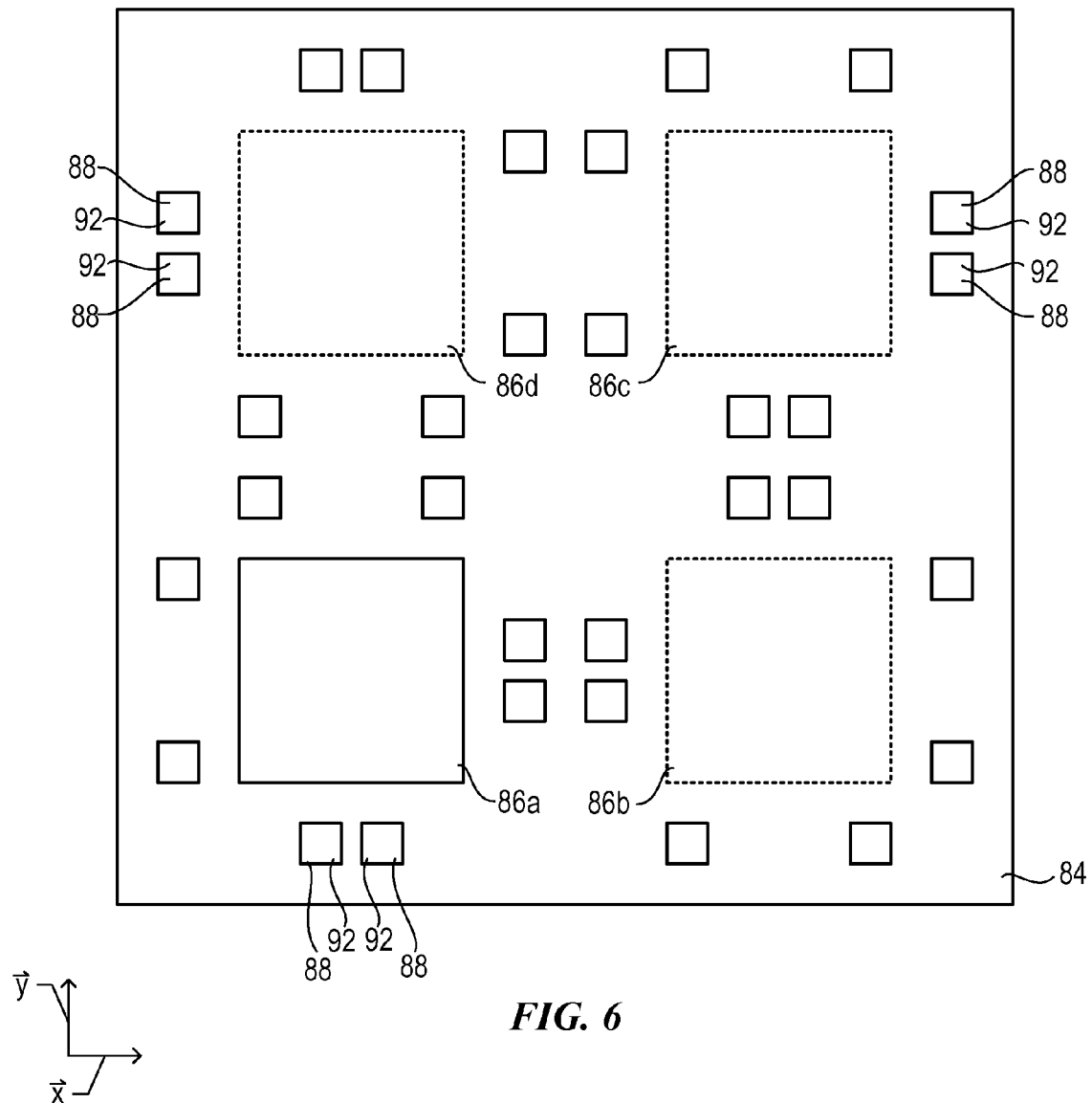
FIG. 6 is a top down view of an intermediate substrate formed from the master template shown in FIG. 1; the intermediate substrate having a first field formed and a plurality of substrate alignment marks.

Referring to FIGS. 4-6, at step 102, polymeric material 34 may be positioned on a intermediate substrate 84 by drop dispense, spin-coating, dip coating, chemical vapor deposition (CVD), physical vapor deposition (PVD), thin film deposition, thick film deposition, and the like. More specifically, intermediate substrate 84 may comprise a plurality of fields 86, shown as fields 86a-86d. However, in a further embodiment, intermediate substrate 84 may comprises any number of fields 86, i.e. 2, 4, 6, 8, or 9 fields. In the present example, the number of fields 86 of intermediate substrate 84 may be substantially the same as the number of sections 64 of mater template 62. To that end, polymeric material 34 may be positioned on field 86a. Furthermore, polymeric material 34 may be positioned on a plurality of regions 88, with regions laying 88 outside of fields 86a-86d. In an example, intermediate substrate 84 may have a thickness of in a range of 0.05 mm to 3 mm.

At step 104, a desired spatial relationship may be obtained between master template 62 and intermediate substrate 84, and more specifically, between field 86a and mesa 72. Further at step 104, polymeric material 34 of field 86a may fill the desired volume between field 86a of intermediate substrate 84 and mesa 72 of master template 62 and polymeric material 34 of regions 88 may fill the desired volume between regions 88 of substrate and alignment forming areas 78 of master template 62.

At step 106, polymeric material 34 positioned on field 86a and regions 88 of intermediate substrate 84 may be solidified and/or cross-linked and mesa 72 of master template 62 may be separated from polymeric material 34 positioned on field 86a, defining a patterned layer 90a, and may be separated from polymeric material 34 positioned on regions 88, defining substrate alignment marks 92. As a result of intermediate substrate 84 having a thickness substantially less than a thickness of master template 62, a separation force may be minimized, which may be desirable.

Figure 7:
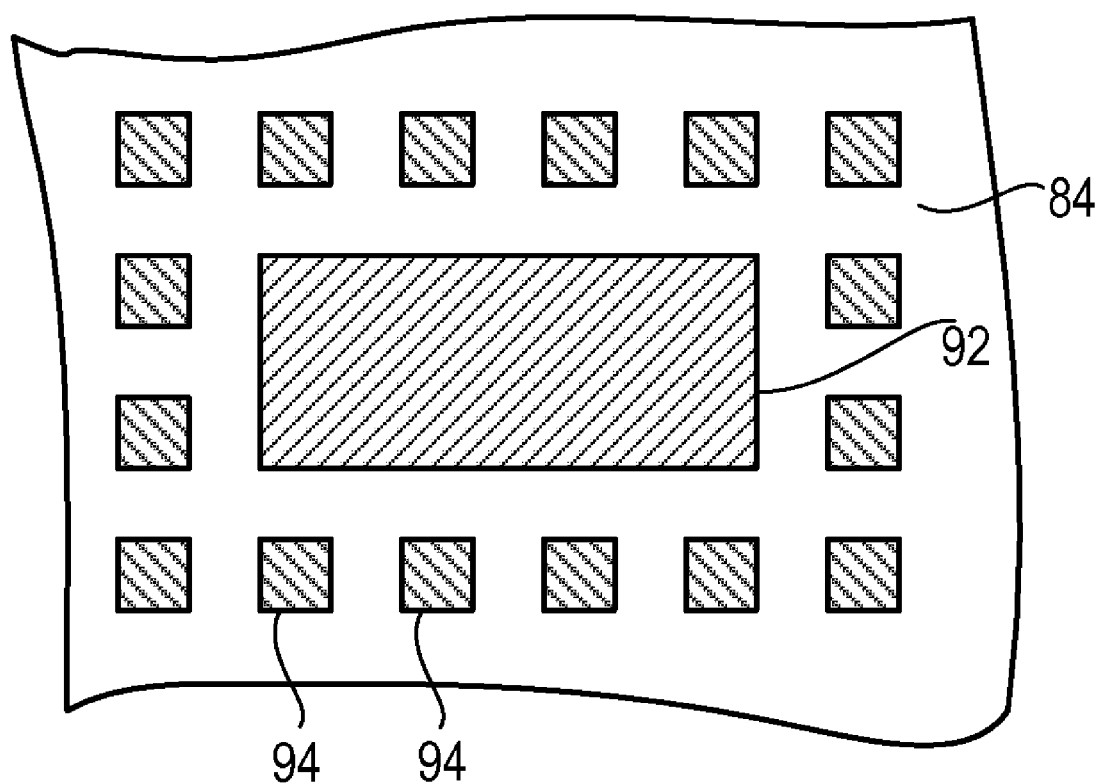
FIG. 7 is a top down view of the substrate alignment marks shown in FIG. 6.

Referring to FIG. 7, in a further embodiment, each of substrate alignment marks 92 may further comprise image placement metrology marks 94. Image placement metrology marks 94 may be measured known image placement or image registration systems, e.g., LMS IPRO available from Leica Microsystems of Bannockburn, Ill.

Figure 8:
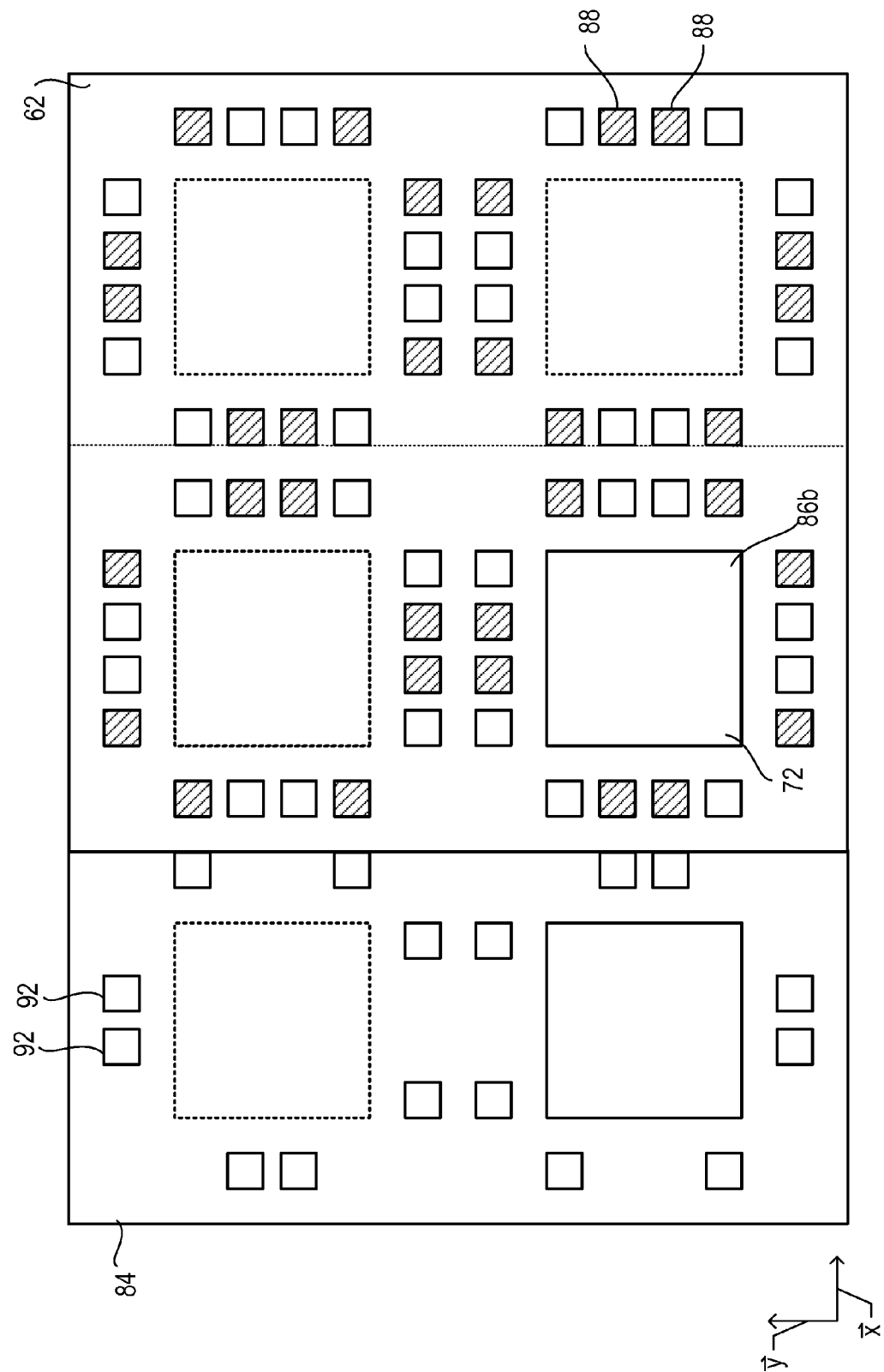
FIG. 8 is a top down view of the master template, shown in FIG. 1, in superimposition with a portion of the intermediate substrate, shown in FIG. 6, with a mesa of the master template being in superimposition with a second field of the intermediate substrate.

Referring to FIGS. 4, 5, and 8, at step 108, polymeric material 34 may be positioned on field 86b in any of the methods mentioned above with respect to FIG. 6 and step 102.

At step 110, a desired spatial relationship may be obtained between template alignment marks 80 of master template 62 and substrate alignment marks 92 of intermediate substrate 84 such that a desired spatial relationship between master template 62 and intermediate substrate 84 may be obtained, and more specifically, in the present example, between field 86b and mesa 72. A desired spatial relationship between template alignment marks 80 and substrate alignment marks 92 may include template alignment marks 80 and substrate alignment marks 92 being in superimposition; however, in a further embodiment, template alignment marks 80 and substrate alignment marks 92 may be offset in the x-y plane a desired amount to compensate for variations among the first, second, third, and fourth patterns 82a, 82b, 82c, and 82d of alignment forming areas 78 and template alignment marks 80.

Alignment between template alignment marks 80 and substrate alignment marks 92 may be determined employing an alignment system as described in U.S. patent application Ser. No. 11/000,331 entitled "Interferometric Analysis for the Manufacture of Nano-Scale Devices," which is incorporated herein by reference. Further at step 110, polymeric material 34 of field 86b may fill the desired volume between field 86b of intermediate substrate 84 and mesa 72 of master template 62.

At step 112, polymeric material 34 positioned on field 86b of intermediate substrate 84 may be solidified and/or cross-linked and mesa 72 of master template 62 may be separated from polymeric material 34 positioned on intermediate substrate 84, defining a patterned layer 90b on field 86b.

Figure 9:
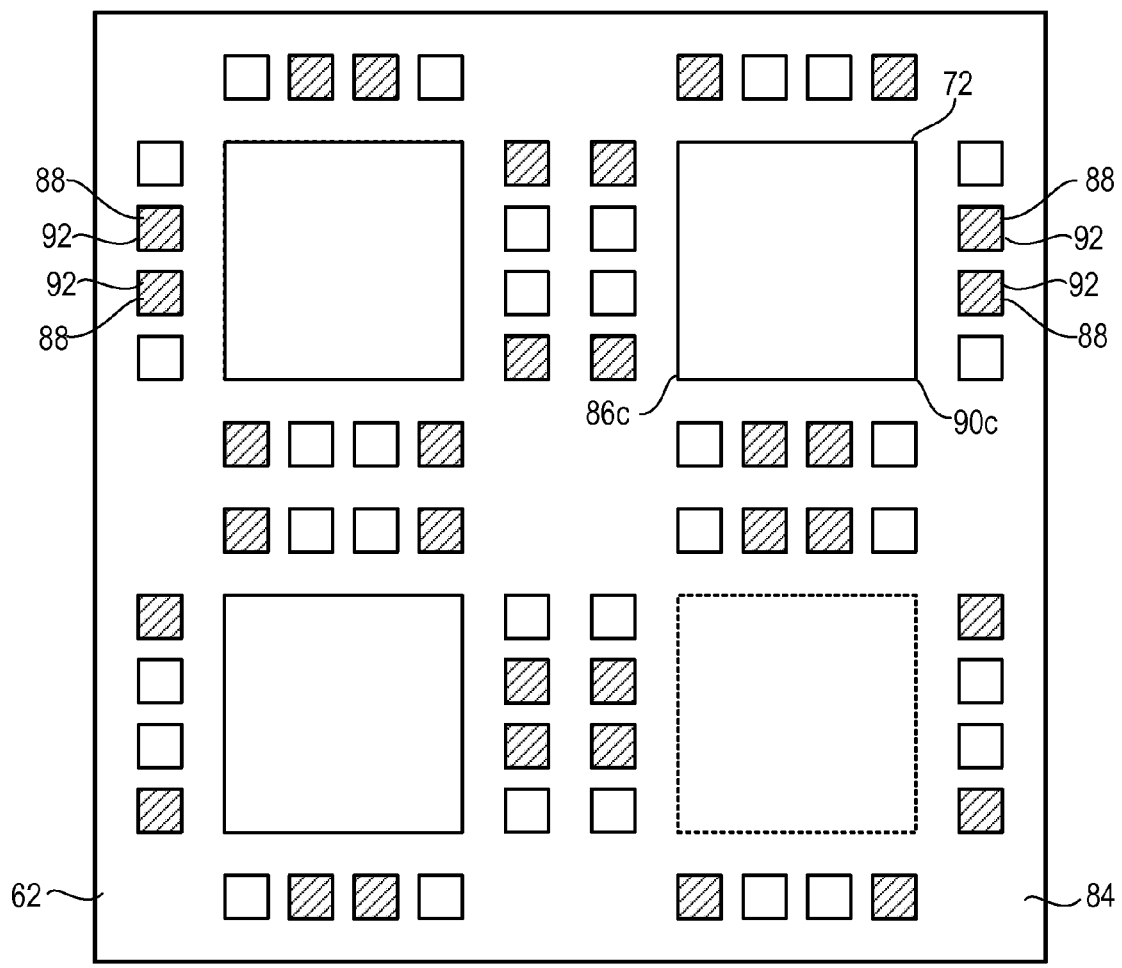
FIG. 9 is a top down view of the master template, shown in FIG. 1, in superimposition with a portion of the intermediate substrate, shown in FIG. 6, with a mesa of the master template being in superimposition with a third field of the intermediate substrate.
Figure 9:
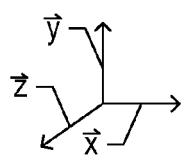

Referring to FIGS. 4, 5, and 9, at step 114, polymeric material 34 may be positioned on field 86c in any of the methods mentioned above with respect to FIG. 6 and step 102.

At step 116, a desired spatial relationship may be obtained between template alignment marks 80 of master template 62 and substrate alignment marks 92 of intermediate substrate 84 such that a desired spatial relationship between master template 62 and intermediate substrate 84 may be obtained, and more specifically, in the present example, between field 86c and mesa 72. To that end, to obtain a desired spatial relationship between template alignment marks 80 of master template 62 and substrate alignment marks 92, master template 62 may be rotated about the z-axis, and more specifically, rotated 180° with respect to intermediate substrate 84. As a result, a desired spatial relationship may be obtained between template alignment marks 80 and substrate alignment marks 92. Further at step 116, polymeric material 34 of field 86c may fill the desired volume between field 86c of intermediate substrate 84 and mesa 72 of master template 62. In a further embodiment, master template 62 may be rotated prior to positioning polymeric material 34 on fields 86c of intermediate substrate 84.

At step 118, polymeric material 34 positioned on field 86c of intermediate substrate 84 may be solidified and/or cross-linked and mesa 72 of master template 62 may be separated from polymeric material 34 positioned on field 86a, defining a patterned layer 90c.

Referring to FIGS. 4 and 5, at step 120, steps 108, 110, and 112 may be repeated for field 86d of intermediate substrate 84, defining patterned layer 90d on field 86d. In a further embodiment, steps 108, 110, and 112 may be repeated for any number of fields 86 of intermediate substrate 84.

Figure 10:
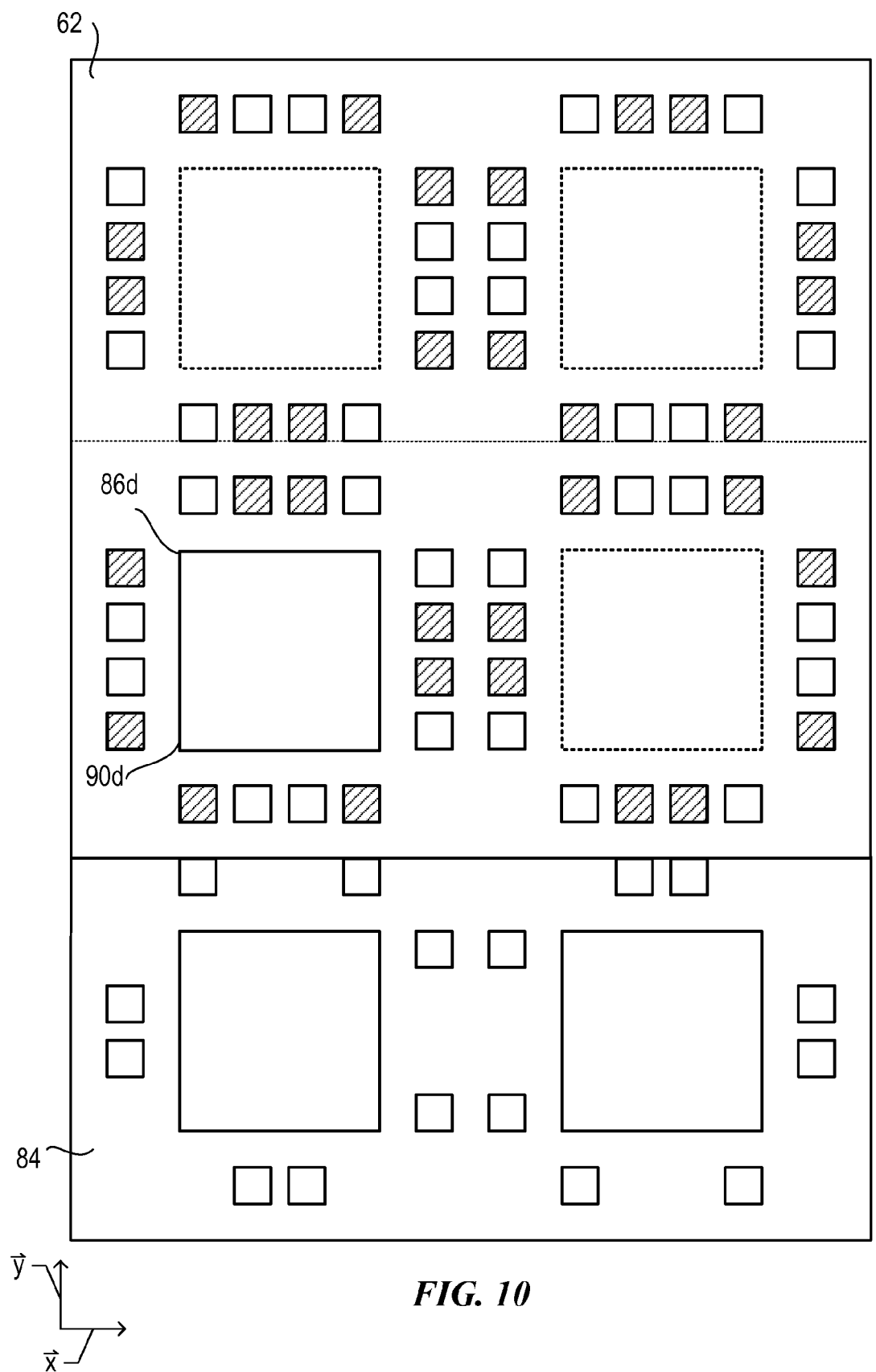
FIG. 10 is a top down view of the master template, shown in FIG. 1, in superimposition with a portion of the intermediate substrate, shown in FIG. 6, with a mesa of the master template being in superimposition with a fourth field of the intermediate substrate.

Referring to FIGS. 4, 5, and 10, after forming patterned layers 90a, 90b, 90c, and 90d on fields 86a, 86b, 86c, and 86d, respectively, intermediate substrate 84 may be employed to form a pattern in a final substrate 96. More specifically, at step 122, polymeric material 34 may be positioned on final substrate 96 employing any of the methods mentioned above with respect to step 102 and FIG. 6. Final substrate 96 may comprise a plurality of fields 98, shown as fields 98a-98d. However, in a further embodiment, final substrate 96 may comprises any number of fields 98, i.e. 2, 4, 6, 8, or 9 fields. In the present embodiment, the number of fields 98 of final substrate 96 may be substantially the same as the number of fields 86 of intermediate substrate 84. To that end, polymeric material 34 may be positioned on fields 98 of final substrate 96. In an example, final substrate 96 may have a thickness of equal to or greater than 4 mm.

At step 124, a desired spatial relationship may be obtained between intermediate substrate 84 and final substrate 96 such that polymeric material 34 on final substrate 96 may fill the desired volume between intermediate substrate 84 and final substrate 96.

At step 126, polymeric material 34 positioned on final substrate 96 may be solidified and/or cross-linked and intermediate substrate 84 may be separated from polymeric material 34 positioned on final substrate 96, defining a plurality of patterned layers 99 in each of fields 98, with each of patterned layers 99 being substantially the same as dies 60 of mold 20, and thus, final substrate 96 may be substantially the same as template 18.

Referring to FIGS. 4-6, in a second embodiment, it may be desired to form template 18 from master template 62 in a single patterning step. To that end, each of patterned layer 90 positioned on fields 86 of intermediate substrate 84 may be substantially the same as dies 60 of mold 20 and thus, intermediate substrate 84 may be substantially the same as template 18. In the present example, master template 62 may have a thickness of approximately 2.29 mm and intermediate substrate 84 may have a thickness of 6.35 mm.

Figure 11:
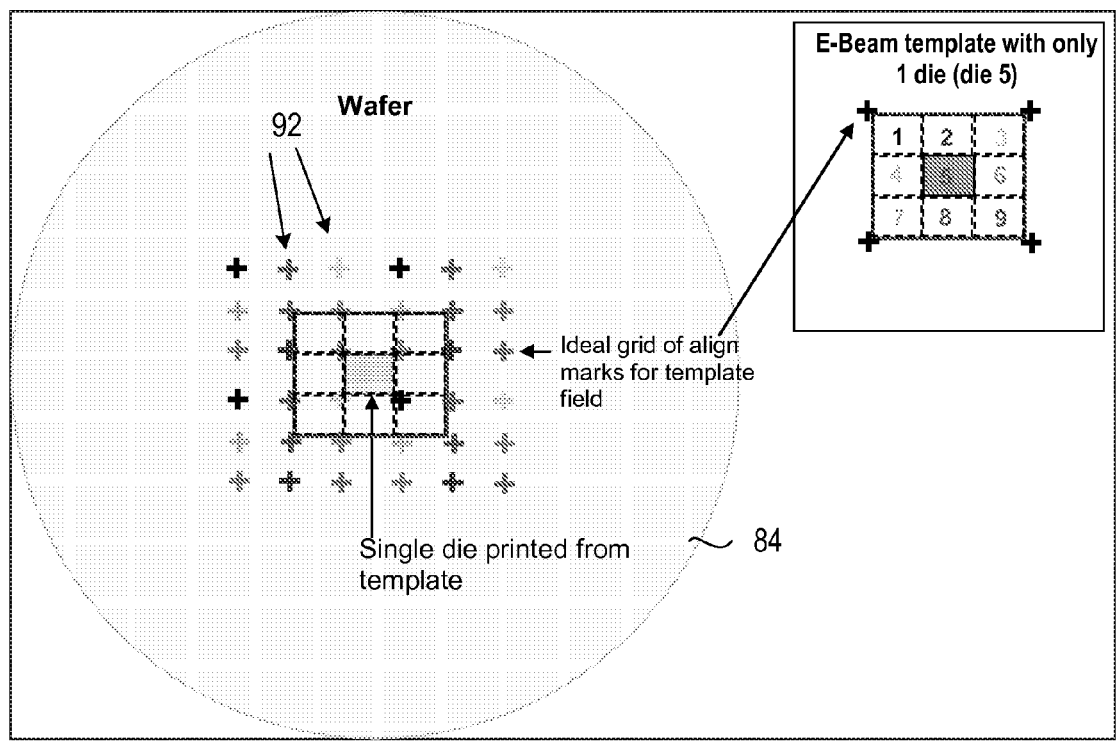
FIG. 11 is a top down view of the intermediate substrate, shown in FIG. 6, with a plurality of alignment marks being formed thereon prior to patterning the intermediate substrate.

Referring to FIG. 11, in still a further embodiment, substrate alignment marks 92 may be formed on intermediate substrate 84 in a separate step. More specifically, substrate alignment marks 92 may be formed on intermediate substrate 84 prior to forming patterned layer 90 on intermediate substrate 84. To that end, substrate alignment marks 92 may be formed employing a) an optical lithography tool with accurate global inteferometry, such as a 913 nm scanner lithography tool available from ASML of the Netherlands or b) an optical lithography tool with excel interferometry, such as the Nanoruler described at http://www.sciencedaily.com/release/2004/02/040203233840.htm, which is incorporated herein by reference. As a result, alignment between fields 86 of intermediate substrate 84 may be obtained, i.e., field to field alignment.

Figure 12:
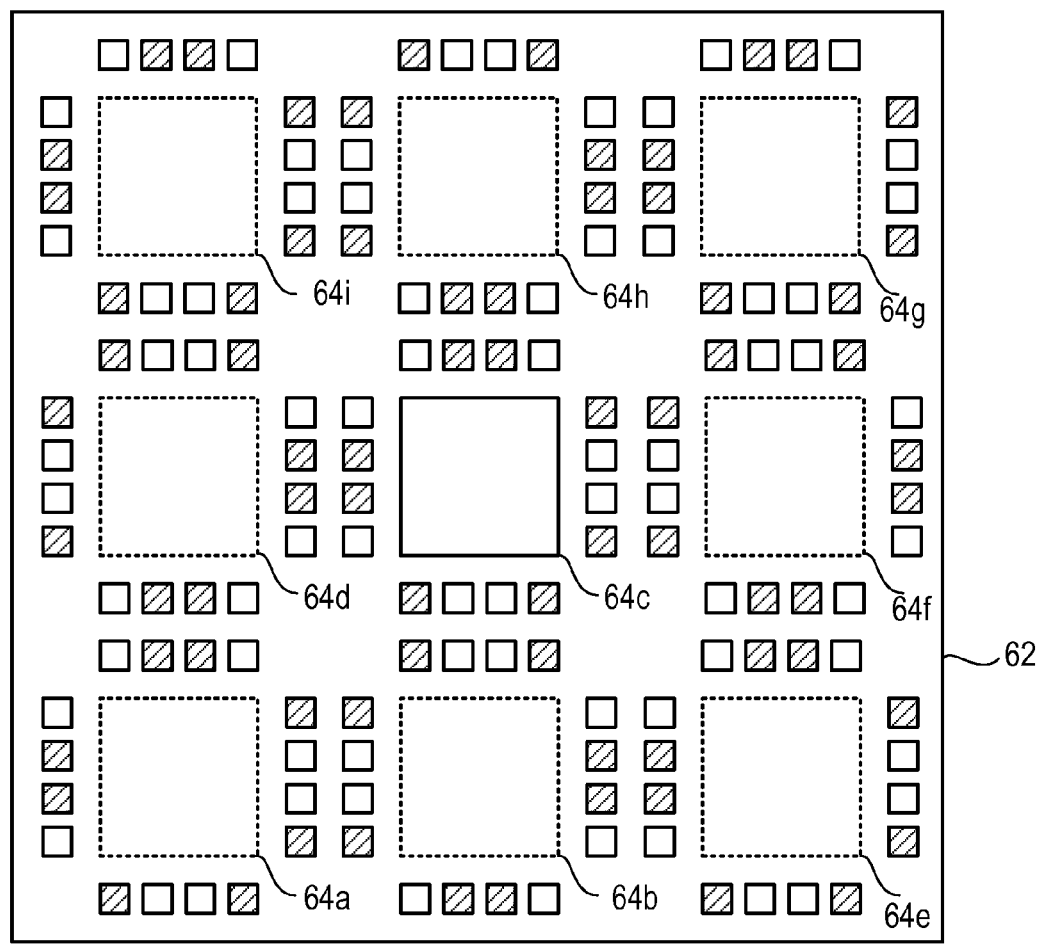
FIG. 12 is a top down view of the master template, the master template having 9 fields associated therewith.
Figure 12:
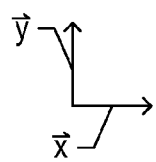

Referring to FIGS. 3, 5, and 6, to that end, as described above, mold 20 may have four dies associated therewith. However, as mentioned above, mold 20 may have any number of dies associated therewith, and thus, master template 62, intermediate substrate 84, and final substrate 96 may scale according. As shown in FIG. 12, master template 62 may have nine sections 64 associated therewith. To that end, each of sections 64 of master template 62 may have a pattern of alignment forming areas 78 and template alignment marks 80 proximate thereto, and more specifically, each section of sections 64 may have a pattern of alignment forming areas 78 and template alignment marks 80 differing from a pattern of alignment forming areas 78 and template alignment marks 80 of surrounding sections of sections 64. More specifically, sections 64a, 64c, 64e, 64g, and 64i may have a fifth pattern of alignment forming areas 78 and template alignment marks 80 proximate thereto and sections 64b, 64d, 64f, and 64h may have a sixth pattern of alignment forming areas 78 and template alignment marks 80 proximate thereto, with the fifth pattern of alignment forming areas 78 and template alignment marks 80 being substantially the same as the first pattern mentioned above with respect to FIG. 5, and the sixth pattern of alignment forming areas 78 and template alignment marks 80 being substantially the same as the third pattern mentioned above with respect to FIG. 5. Further, each of sections 64e, 64g, and 64i may be patterned in the above-mentioned method analogous to patterning of section 64c and each of sections 64f and 64h may be patterned in the above-mentioned method analogous to patterning of sections 64b and 64d.

Furthermore, it may be desired to minimize mechanical distortions present in template 18 formed in any of the methods mentioned above. To that end, master template 62, intermediate substrate 84, and final substrate 96 may be substantially flat. More specifically, master template 62, intermediate substrate 84, and final substrate 96 may have a flatness better than 100 nm, preferably better than 50 nm, preferably better than 20 nm and further preferably better than 10 nm over the patterning area. To further minimize the aforementioned mechanical distortions, inter alia, minimize image placement errors, intermediate substrate 84 may conform to master template 62. To that end, master template 62, intermediate substrate 84, and final substrate 96 may be positioned upon a chuck analogous to substrate chuck 14 mentioned above with respect to FIG. 1. To that end, a shape of master template 62, intermediate substrate 84, and final substrate 96 may be determined employing an air gauge system (not shown) coupled with an XY stage (not shown); a laser distance sensor system (not shown) coupled with an XY stage (not shown); or a full field 3D profiler (not shown) as described in http://www.zygo.com/?/products/meterology.htm, which is incorporated by reference herein. Moreover, each of master template 62, intermediate substrate 84, and final substrate 96 may be formed from substantially the same material, with the material including but not limited to, fused-silica and ultra-low-expansion glass. Further, a difference in temperature between master template 62, intermediate substrate 84, and final substrate 96 may be less than 0.05° C., preferably less than 0.01° C., and further preferably less than 0.001° C.

To further minimize, if not prevent, errors present formed in any of the methods mentioned above, in the first embodiment mentioned above, master template 62 may have an actuation system coupled thereto analogous to actuation system 58 mentioned above with respect to FIG. 1. In the second embodiment mentioned above, final substrate 96 may have an actuation system coupled thereto analogous to actuation system 58 mentioned above with respect to FIG. 1.

The above-mentioned methods may be analogously employed in formation of photomasks for photolithography. Photomasks are typically 4× (the relief pattern of the photomask is 5 times the size of the desired features to be formed on the substrate). Advanced photomask that may be employed in photolithography with KrF (248 nm) laser and ArF (193 nm) laser may further comprise sub-resolution features that are smaller than the primary features. These sub-resolution may be also known as optical proximity correction features or reticle enhanced features. The sub-resolution features do not print; they are designed to enhance the quality of the primary features. As mentioned above, the primary features are 4×. For example, for a features of the seize of 50 nm on the wafer, the primary photomask features is 200 nm. The sub-resolution features may be as small as 1× or smaller or as large as approaching 4×. Typically the small sub-resolution features are about 1.5×; for 50 nm wafer features, this translates to 75 nm on the photomask. The 4× photomasks are for example are of size 100 mm by 100 mm for a 25 mm by 35 mm wafer field size; and 104 mm by 132 mm for a 26 mm by 33 mm wafer field size. These fields typically have 2, 4, 6, or more dies in them each of which have substantially the same pattern requirements. Thus, the above-mentioned method may be analogously employed in formation of photomasks for photolithography.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method of patterning a substrate comprising first and second fields with a template having a plurality of sections, a first section having a mold and a first subset of alignment forming areas and a plurality of template alignment marks defining a first pattern, and a second section having a second subset of alignment forming areas and a plurality of template alignment marks defining a second pattern wherein the first pattern corresponds to the second pattern, said method comprising:

positioning a material on said first field of said substrate and a plurality of regions of said substrate, said plurality of regions laying outside of said first and second fields;

positioning said mold and said substrate such that a desired spatial relationship between said mold and said first field of said substrate is obtained to define a pattern in said material on said first field of said substrate while concurrently defining a plurality of substrate alignment marks with said material in said plurality of regions of said substrate in superimposition with said second section of said template;

positioning a material on said second field of said substrate; and positioning said mold and said substrate to obtain a desired spatial relationship between said first subset of template alignment marks and said plurality of substrate alignment marks such that a desired spatial relationship between said mold and said second field of said substrate is obtained to define a pattern in said material on said second field of said substrate.

2. The method as recited in claim 1 wherein said template alignment marks comprise grating alignment marks and said substrate alignment marks comprise checkerboard alignment marks.

3. The method as recited in claim 1 wherein said plurality of alignment forming areas of said template are positioned on a plurality of mesas on said template.

4. The method as recited in claim 3 wherein said template comprises a first surface and a second surface positioned opposite to said first surface, with said mold extending from said second surface a first distance and a subset of said plurality of mesas extending from said second surface a second distance, with said first distance being substantially equal to said second distance.

5. The method as recited in claim 1 wherein said plurality of template alignment marks of said template are positioned on a plurality of mesas on said template.

6. The method as recited in claim 5 wherein said template comprises a first surface and a second surface positioned opposite to said first surface, with said mold extending from said second surface a first distance and a subset of said plurality of mesas extending from said second surface a second distance, with said first distance being greater than said second distance.

7. The method as recited in claim 1 wherein said template further comprises a plurality of non patterned mesas, wherein positioning said material further comprising positioning a material in areas of said substrate in superimposition with said plurality of non-patterned mesas.

8. The method as recited in claim 1 wherein said substrate has a thickness in a range of 0.05 mm to 8 mm.

9. The method as recited in claim 1 wherein said substrate has a flatness less than 100 nm.

10. The method as recited in claim 1 wherein said substrate and said template comprise substantially the same composition, with said composition being selected from a set of compositions consisting of fused silica and ultra-low-expansion glass.

11. The method as recited in claim 1 wherein a difference in temperature between said substrate and said template is less than 2° C.

12. The method as recited in claim 1 wherein obtaining said desired spatial relationship between said first region and said mold further comprises positioning said mold and said substrate such that said mold is in superimposition with said first region of said substrate.

13. The method as recited in claim 1 wherein obtaining said desired spatial relationship between said second region and said mold further comprises positioning said mold and said substrate such that said mold is in superimposition with said second region of said substrate.

14. The method as recited in claim 1 further comprises coupling said template to a shape modulating chuck.

15. The method as recited in claim 1 further comprises coupling said substrate to a shape modulating chuck.

16. The method as recited in claim 1 further comprises altering a shape of said template via an actuation system coupled thereto.

17. The method as recited in claim 1 further comprises altering a shape of said substrate via an actuation system coupled thereto.

18. The method as recited in claim 1 wherein said substrate further comprises a plurality of fields.

\* \* \* \* \*

UNITED STATES PATENT AND TRADEMARK OFFICE
CERTIFICATE OF CORRECTION

PATENT NO.         : 7,780,893 B2
APPLICATION NO.    : 11/695850
DATED              : August 24, 2010
INVENTOR(S)        : Sreenivasan et al.

It is certified that error appears in the above-identified patent and that said Letters Patent is hereby corrected as shown below:

Column 8, line 41 "features of the seize" should be changed to --feature of the size--.
Column 8, line 42 "features" should be changed to --feature--.

Signed and Sealed this

Twenty-eighth Day of September, 2010

David J. Kappos
*Director of the United States Patent and Trademark Office*